(12) United States Patent
David

(10) Patent No.: US 6,259,525 B1
(45) Date of Patent: Jul. 10, 2001

(54) SEMICONDUCTOR WAFER ALIGNMENT TOOLS

(75) Inventor: Doug David, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/512,981

(22) Filed: Feb. 24, 2000

Related U.S. Application Data

(62) Division of application No. 09/145,492, filed on Sep. 1, 1998, now Pat. No. 6,068,954.

(51) Int. Cl.[7] .............................. G01B 11/00; H01L 21/76
(52) U.S. Cl. ..................... 356/399; 356/401; 438/401; 430/22
(58) Field of Search .............. 438/401; 430/22; 356/399, 401

(56) References Cited

U.S. PATENT DOCUMENTS

| | | | |
|---|---|---|---|
| 5,601,957 | * 2/1997 | Mizutani et al. | 430/22 |
| 5,656,182 | 8/1997 | Marchman et al. | 430/4 |
| 5,879,842 | 3/1999 | Okino | 430/22 |
| 5,925,937 | * 7/1999 | Jost et al. | 257/797 |

* cited by examiner

Primary Examiner—Frank G. Font
Assistant Examiner—Layla Lauchman
(74) Attorney, Agent, or Firm—Wells, St. John, Roberts, Gregory & Matkin

(57) ABSTRACT

In one embodiment, a photomask is provided having a set of alignment pattern openings and circuitry openings formed therethrough. With the photomask, the substrate is first photoexposed through one of the set of alignment pattern openings and the circuitry openings and not the other. After the first exposing, the substrate is second exposed through the other of the openings on the photomask. In another embodiment, a latent image of an alignment pattern is formed and received by a masking layer over a substrate. The position of the latent image of the alignment pattern is inspected relative to an underlying layer of material over the substrate. Alignment is ascertained through inspection of the latent image relative to the underlying layer of material. In another embodiment, an undeveloped photoresist layer is formed over a substrate. The undeveloped photoresist is exposed to processing conditions effective to form an image of an alignment pattern received over the undeveloped photoresist over a wafer scribe area. The image of the alignment pattern received by the undeveloped photoresist is inspected relative to an underlying substrate structure over the scribe area and alignment information is ascertained therefrom. In a preferred embodiment, if an alignment error is detected, the error can be corrected in real time, and the substrate further processed without reapplication of a masking layer or photoresist layer.

9 Claims, 6 Drawing Sheets

SEMICONDUCTOR WAFER ALIGNMENT TOOLS

This application is a divisional application of U.S. patent application Ser. No. 09/145,492 6,068,954 6,068,954 Jun. 15, 2000.

TECHNICAL FIELD

This invention relates to semiconductor wafer alignment methods and to semiconductor wafer alignment tools.

BACKGROUND OF THE INVENTION

Integrated circuits are typically formed through a number of steps which include patterning and etching various features over a substrate. A necessary requirement imposed on the patterning and etching of substrate features is that such features be aligned relative to other features on the substrate. Failure to achieve adequate alignment can render a fabricated device inoperative.

One way of maintaining alignment during a fabrication process, which often involves forming multiple layers over a substrate and aligning each of the layers to one or more other layers, is to use so-called alignment or registration marks. Alignment or registration marks are typically provided over a scribe area of a wafer between individual die area. Alignment or registration marks can be provided on a substrate through utilization of a mask which contains not only alignment mark patterns, but also integrated circuitry patterns as well. One past practice has been to expose the entire mask, including the integrated circuitry patterns, to lithographic processing, and then inspect the transferred alignment patterns for alignment. If the alignment patterns were not desirably aligned, the alignment process was repeated by removing the patterned layer, re-applying and patterning it, and then inspecting for alignment. For example, a layer of photoresist will typically be formed over a substrate. A mask will be utilized to form a pattern over the photoresist, which photoresist is subsequently developed to provide alignment marks over the substrate, as well as integrated circuitry patterns. If the alignment marks are not desirably aligned, the photoresist is removed, reapplied (which can include time-consuming baking), reexposed, redeveloped and examined for misalignment again. Needless to say, removal, reapplication, reexposure, redevelopment, and reexamination of the photoresist takes precious production time and reduces throughput of the wafers.

This invention arose out of concerns associated with improving the methods through which integrated circuitry devices are formed, and in particular, with providing improved wafer alignment methods and tools.

SUMMARY OF THE INVENTION

In one embodiment, a photomask is provided having a set of alignment pattern openings and circuitry openings formed therethrough With the photomask, the substrate is first photoexposed through one of the set of alignment pattern openings and the circuitry openings, and not the other. After the first exposing, the substrate is second exposed through the other of the openings on the photomask. In another embodiment, a latent image of an alignment pattern is formed and received by a masking layer over a substrate. The position of the latent image of the alignment pattern is inspected relative to an underlying layer of material over the substrate. Alignment is ascertained through inspection of the latent image relative to the underlying layer of material. In another embodiment, an undeveloped photoresist layer is formed over a substrate. The undeveloped photoresist is exposed to processing conditions effective to form an image of an alignment pattern received over the undeveloped photoresist over a wafer scribe area. The image of the alignment pattern received by the undeveloped photoresist is inspected relative to an underlying substrate structure over the scribe area and alignment information is ascertained therefrom. In a preferred embodiment, if an alignment error is detected, the error can be corrected in real time, and the substrate further processed without reapplication of a masking layer or photoresist layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
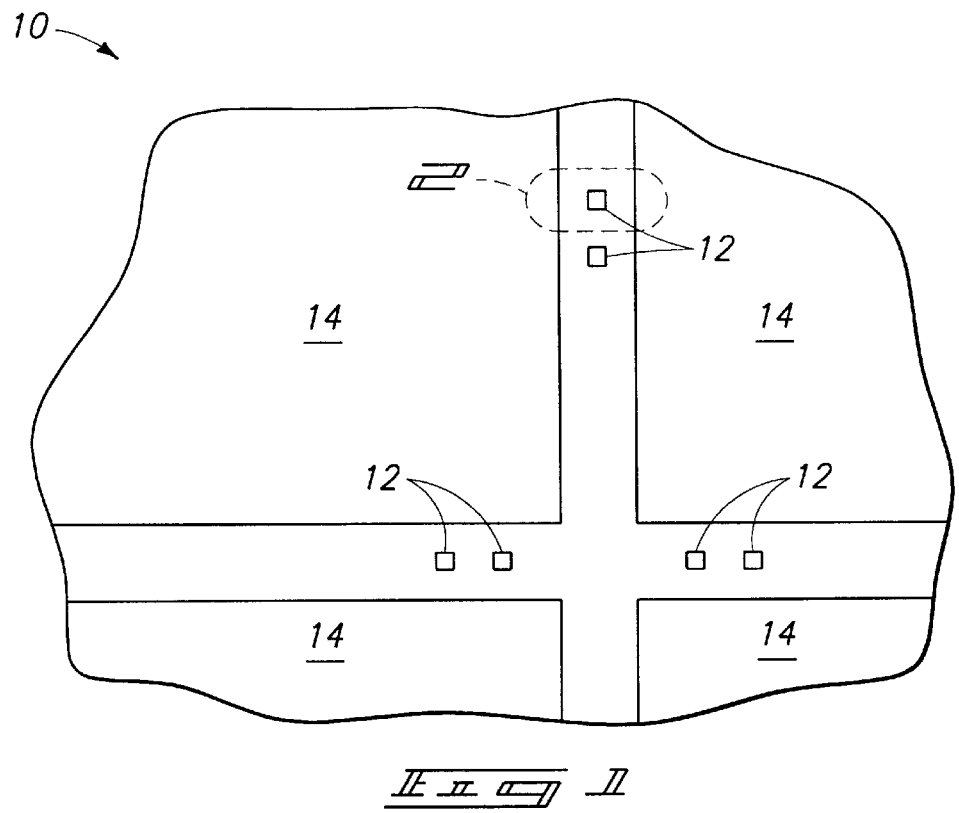
FIG. 1 shows a top plan view of a mask in accordance with one embodiment of the present invention.

Referring to FIG. 1, a portion of a photomask is provided generally at 10 and includes a set of alignment pattern openings 12 and areas 14 within which integrated circuitry openings defining integrated circuitry patterns are provided. Alignment pattern openings 12 and integrated circuitry openings within areas 14 are disposed adjacent one another. Photomask 10 is to be used to transfer openings 12, and integrated circuitry openings defining integrated circuitry patterns within areas 14 onto a substrate as described below.

Figure 2:
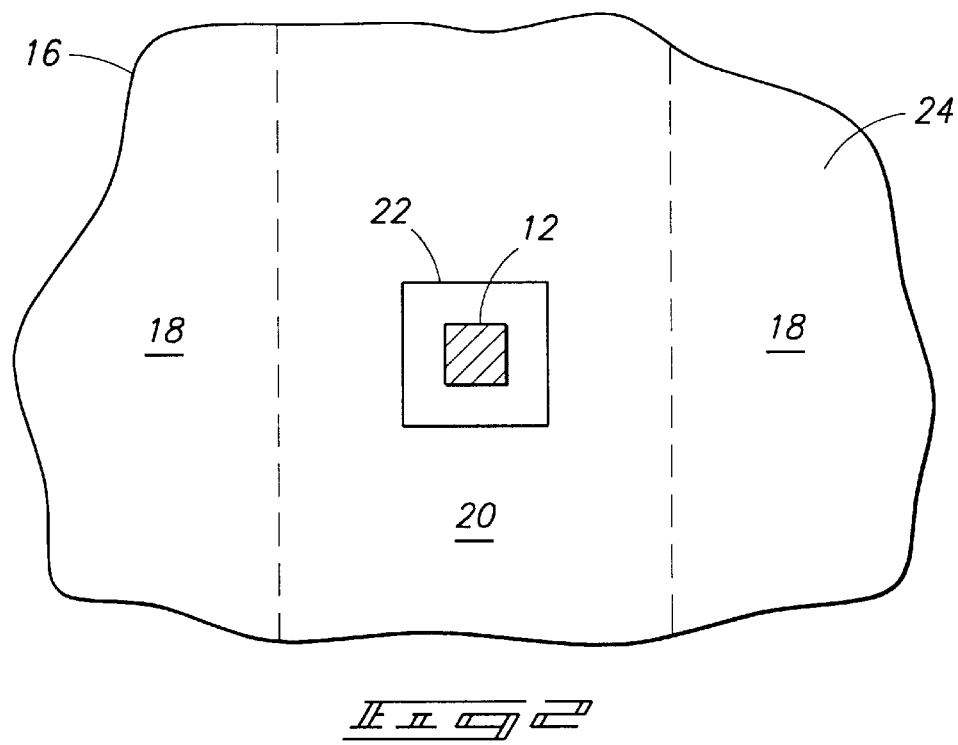
FIG. 2 shows a portion of a substrate having exposed thereon an alignment pattern in accordance with one embodiment of the present invention.

Referring to FIG. 2, a semiconductor wafer substrate is provided at 16. Substrate 16 comprises die areas 18 within which active devices are to be disposed, and various dedicated alignment areas or scribe areas 20 which are displaced from die areas 18 and within which alignment processing is to take place. The boundaries between areas 18, 20 are shown by a dashed line. Alignment areas or scribe areas 20 contain various alignment reference marks which are utilized to align various layers during processing. In the illustrated example, one such alignment reference mark is shown at 22 which is disposed within a previously-provided underlying layer.

In one embodiment, a layer of undeveloped photoresist 24 is formed over substrate 16 and exposed to processing conditions effective to form an image of an alignment patter 12 (corresponding to alignment pattern opening 12 in FIG. 1) received by the undeveloped photoresist 24 over wafer scribe area 20. Subsequently, the image of alignment pattern 12 received by undeveloped photoresist layer 24 is inspected relative to an underlying substrate structure, which in this example comprises alignment reference mark 22. Such inspection enables one to ascertain whether the image of alignment pattern 12 is aligned with the underlying substrate structure. Inspection can take place through visual inspection or automated inspection using conventional metrology tools, or tools such as those described in connection with the invention below. Such constitutes an improvement over prior processes which required that the photoresist be developed prior to inspection for alignment. In this embodiment, the photoresist is not developed prior to inspection for alignment. This can significantly improve processing time and increase throughput. In addition, any perceived misalignments can be corrected on the spot thereby providing for effective real time alignment correction. Specifically, if a misalignment is detected, such can be corrected prior to exposure of unexposed photoresist over other wafer areas, which, in a preferred embodiment comprises exposure to transfer integrated circuitry patterns into the photoresist.

In another embodiment, a latent image of alignment pattern 12 is received by a masking layer, such as photoresist layer 24, over substrate 16. A latent image is an image which has been introduced into an energy sensitive material, e.g. by exposing the material to radiation, and in some cases, baking the material, but which has not been developed. Subsequently, the position of the latent image of alignment pattern 12 is inspected relative to an underlying layer of material over the substrate. Hence, a determination can be made whether the latent image of alignment pattern 12 is aligned within desired alignment tolerances. In this instance, the underlying layer of material relative to which the latent image is inspected contains an alignment reference mark 22 relative to which the latent image of alignment pattern 12 is compared. Preferably, a plurality of transferred alignment images are formed over the substrate so that alignment inspection can take place in both X and Y directions. By using a latent image of the alignment pattern, other portions of the masking layer not having the latent image formed thereon can be preserved for further processing. For example, if no misalignment is detected, those other portions of the masking layer can be processed to form integrated circuitry. If a misalignment is detected, the misalignment can be corrected on the spot, with further processing of the other portions of the masking layer taking place to form integrated circuitry.

Figure 9:
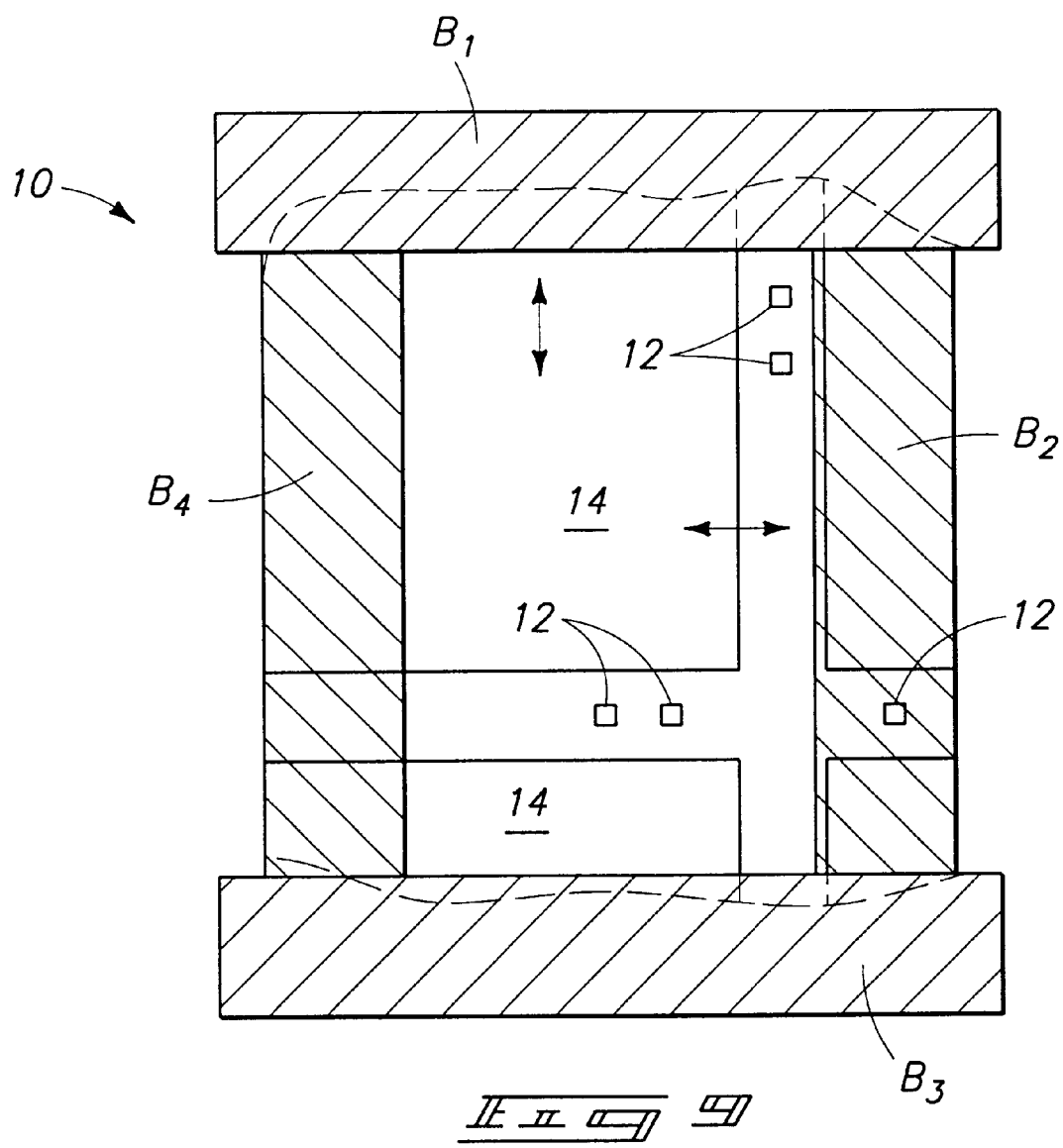
FIG. 9 is a top plan view of an integrated assembly comprising a mask, in accordance with one embodiment of the present invention.

In another embodiment, layer 24 is exposed to processing conditions through a partially obscured mask effective to form a latent image of alignment pattern 12 over the substrate. In the illustrated example, portions of mask 10 (FIG. 1) can be blocked, with subsequent processing forming images of only unblocked portions of the mask over the substrate. In a preferred mask-blocking embodiment, at least portions of the integrated circuitry patterns on the mask, and preferably all of the integrated circuitry patterns on the mask are blocked. One way of implementing a mask-blocking embodiment is shown in FIG. 9 which shows an integrated assembly known as a Reticle Masking Assembly (REMA) comprising a plurality of blades $B_1$, $B_2$, $B_3$, and $B_4$. The blades are independently-movable and can be provided in the same plane. The blades can be moved in the X and Y directions. The blades can be controlled to adjust, as needed, to expose a desired image on a substrate, and block out the rest of the mask during exposure. For example, blades $B_1$–$B_4$ can be programmed to allow exposure of only the uppermost alignment patterns 12.

After transfer of the pertinent patterns, inspection of the position thereof relative to other substrate features, such as alignment reference mark 22, can take place to ascertain whether the latent image of the alignment pattern is aligned within desired alignment tolerances. In a preferred embodiment, if the latent image of the alignment pattern is aligned within desired tolerances, then the masking material 24 is exposed to processing conditions through a less obscured mask effective to transfer an integrated circuitry pattern onto the masking material. In the FIG. 9 example, such could comprise moving blades $B_1$–$B_4$ to positions which enable the integrated circuitry pattern borne by the mask to be exposed. Subsequently, the masking material can be developed. In a preferred mask-blocking embodiment such as the one described above, the previously-blocked mask can be unblocked to provide a less obscured mask wherein the less obscured and obscured masks comprise the same mask.

In another embodiment, after photoresist 24 is formed over substrate 16, the development properties of photoresist 24 are initially modified over alignment reference marks 22 and not any of the photoresist over die areas 18. Inspection can then take place of the photoresist over alignment marks 22 to ascertain whether the development-modified photoresist is aligned relative to alignment reference marks 22. In this example, modification of the development properties of the photoresist comprises transferring, but not developing, an image of alignment pattern 12 into the photoresist.

In yet another embodiment, the substrate is initially photoexposed through one of the set of alignment pattern openings and the circuitry openings and not the other. Subsequent alignment processing can take place as described above and below.

Figure 3:
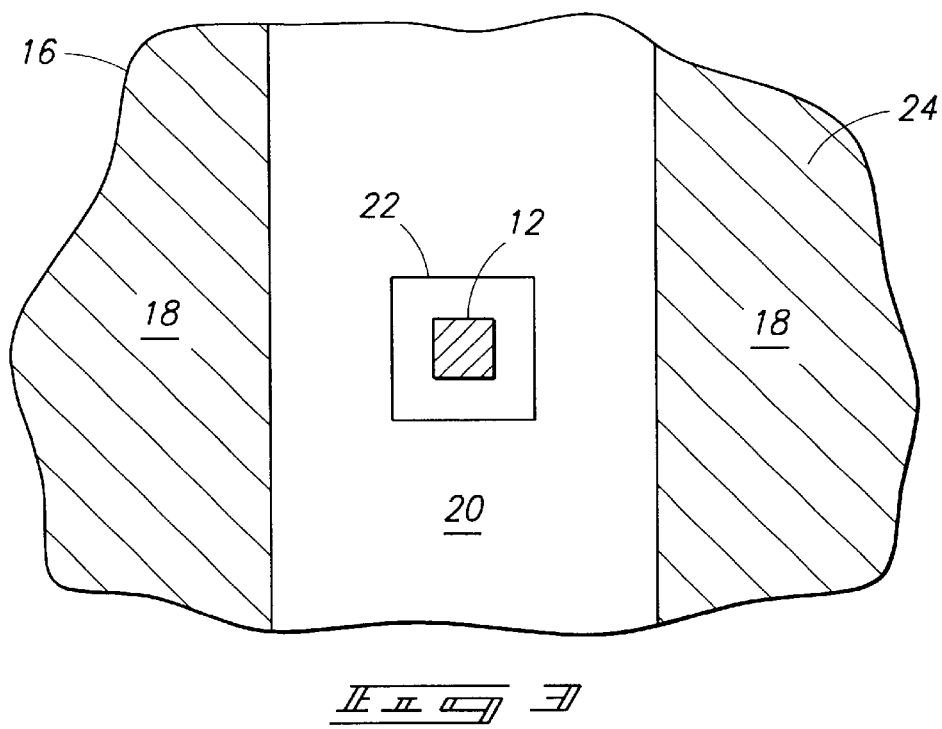
FIG. 3 shows a portion of a substrate which is processed in accordance with one embodiment of the present invention.

Referring to FIG. 3, if the latent image or development-modified photoresist is within desired alignment tolerances (illustrated in this example by a centered pattern 12 within pattern 22), mask 10 can further be used to expose substrate 16 to lithographic processing conditions which are effective to transfer the integrated circuitry patterns corresponding to integrated circuitry openings within areas 14 onto the masking layer. This is illustrated in FIG. 3 in the form of cross hatching which occurs in die areas 18 where previously it had none. In this embodiment, the previous exposing of the substrate to form a latent image does not expose any of the openings on the mask associated with the integrated circuitry patterns. Accordingly, such constitutes after the first exposing of the substrate, second photoexposing the substrate through the other of the openings on the photomask. In this specific example, the first exposed openings comprise the alignment pattern openings 12 (FIG. 1).

In another embodiment, the mask 10 is not moved relative to the substrate between the first and second photoexposings. In this example, the position of alignment pattern 12 is analyzed intermediate the first and second photoexposings.

In another embodiment, exposing of the masking layer comprises forming one or more latent images of only alignment patterns over the substrate and not any integrated circuitry patterns over the substrate. In the illustrated and preferred embodiment, the latent image of the alignment patterns and the underlying alignment pattern comprise box-in-box alignment patterns. It is to be understood, however, that other alignment patterns other than the illustrated box-in-box alignment patterns can be utilized.

Figure 4:
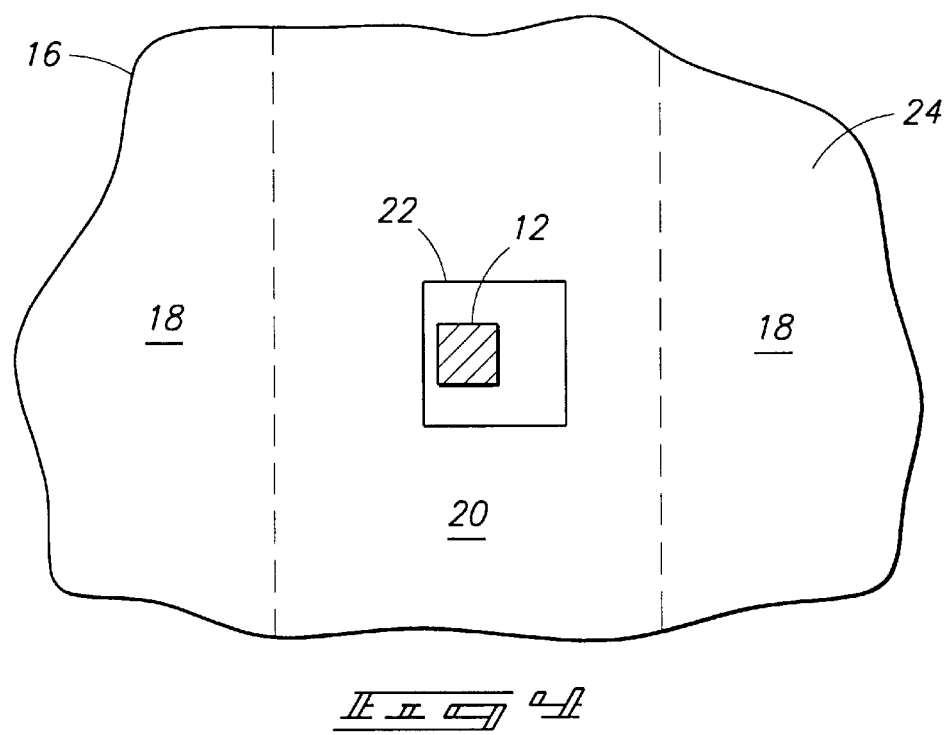
FIG. 4 is a top plan view of a substrate having an alignment pattern exposed thereon in accordance with another embodiment of the invention.

Referring to FIG. 4, alignment pattern 12 is shown in a processing step which is the same as that which is shown in FIG. 2. In this example, inspection of alignment pattern 12 relative to the underlying layer in which alignment reference mark 22 is disposed, indicates that alignment pattern 12 is misaligned or is not aligned within desired tolerances. Such can be ascertained in this particular example because alignment pattern 12 is not centered within alignment pattern 22. Where, as here, the latent image of alignment pattern 12 is not within the desired alignment tolerances, the relative positioning of the mask and the substrate can be changed or corrected to within desired tolerances. In a preferred embodiment, the substrate can be moved relative to the mask, as by moving a wafer stage upon which a wafer or substrate is received. In the preferred embodiment, the correction for mask misalignment takes place prior to transfer of any of the integrated circuitry patterns. Although FIG. 4 shows a translation error resulting in a misalignment, other alignment errors can be processed in accordance with various aspects of the invention. For example, alignment errors stemming from rotational displacement, magnification errors, trapezoidal errors, and/or distortion can all be addressed by various embodiments of the invention.

Figure 5:
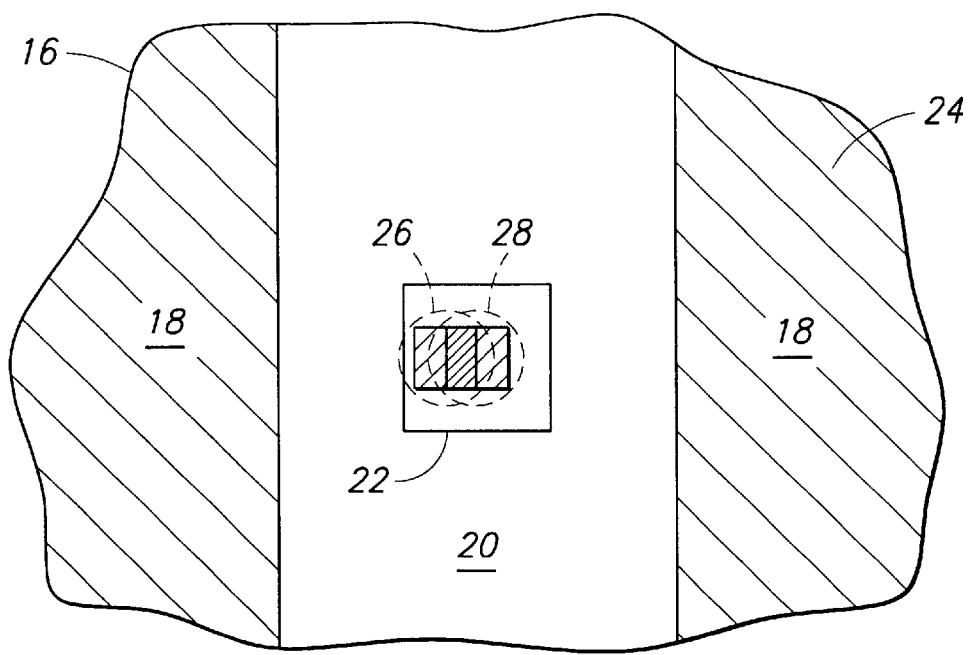
FIG. 5 is a view of a substrate portion which is processed in accordance with another embodiment of the invention.

In one embodiment, if the latent image is not aligned within desired alignment tolerances, an alignment correction is calculated. The calculated alignment correction can take into account alignment errors stemming from not only translational errors, but also rotational displacement, magnification errors, trapezoidal errors, and/or distortion. After calculating the alignment correction, the relative positions of the mask and substrate are corrected prior to reexposing the substrate to transfer the integrated circuitry patterns. In a preferred embodiment, correction of the relative positions of the mask and substrate is effectuated by moving the substrate relative to the mask. Such is illustrated in FIG. 5. There, the cross hatched areas over die areas 18 correspond to transferred integrated circuitry patterns which have been transferred from a position-corrected substrate. The original misaligned position of alignment pattern 12 is shown encircled by a dashed line at 26. The subsequent corrected position of alignment pattern 12 is shown encircled by a dashed line at 28. The photoresist is reexposed to processing conditions through the mask effective to form images defined by the mask which are received over the wafer.

Figure 6:
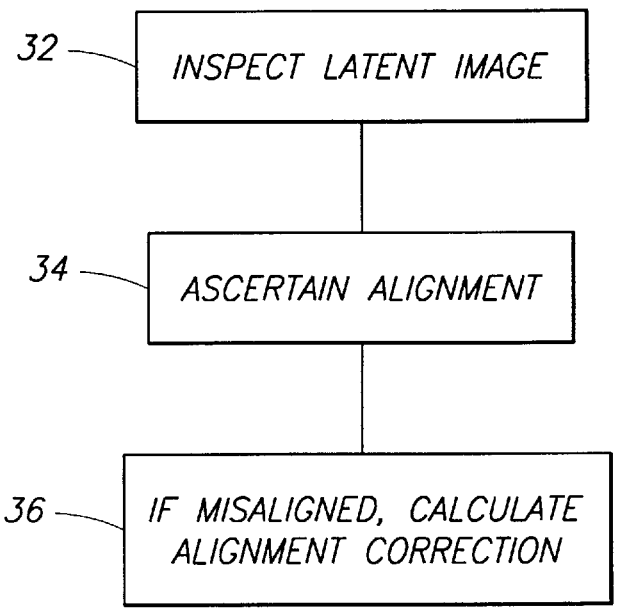
FIG. 6 is a high level flow diagram which illustrates one method in accordance with one embodiment of the present invention.

Referring to FIG. 6, a flow diagram of certain methodical aspects of the invention is set forth generally at 30. The illustrated method comprises using a latent image of an alignment pattern which is received by an undeveloped masking material layer to ascertain whether the latent image of the alignment pattern is aligned relative to a substrate over which it is received.

In a preferred embodiment, the position of the latent image is inspected, at 32, relative to an underlying substrate layer. In a preferred embodiment, the underlying substrate layer comprises an alignment pattern relative to which the latent image is inspected. Alignment of the latent image is ascertained, at 34, relative to the underlying layer. At 36, if the latent image is misaligned, an alignment correction is calculated and implemented to correct the misaligned image. In a preferred embodiment, implementation of the alignment correction comprises moving or repositioning the substrate relative to the mask.

Various methods of the invention can be implemented by a computer having a computer-readable medium on which are stored instructions which, when executed by the computer, implement one or more embodiments of the above-described invention.

Figure 7:
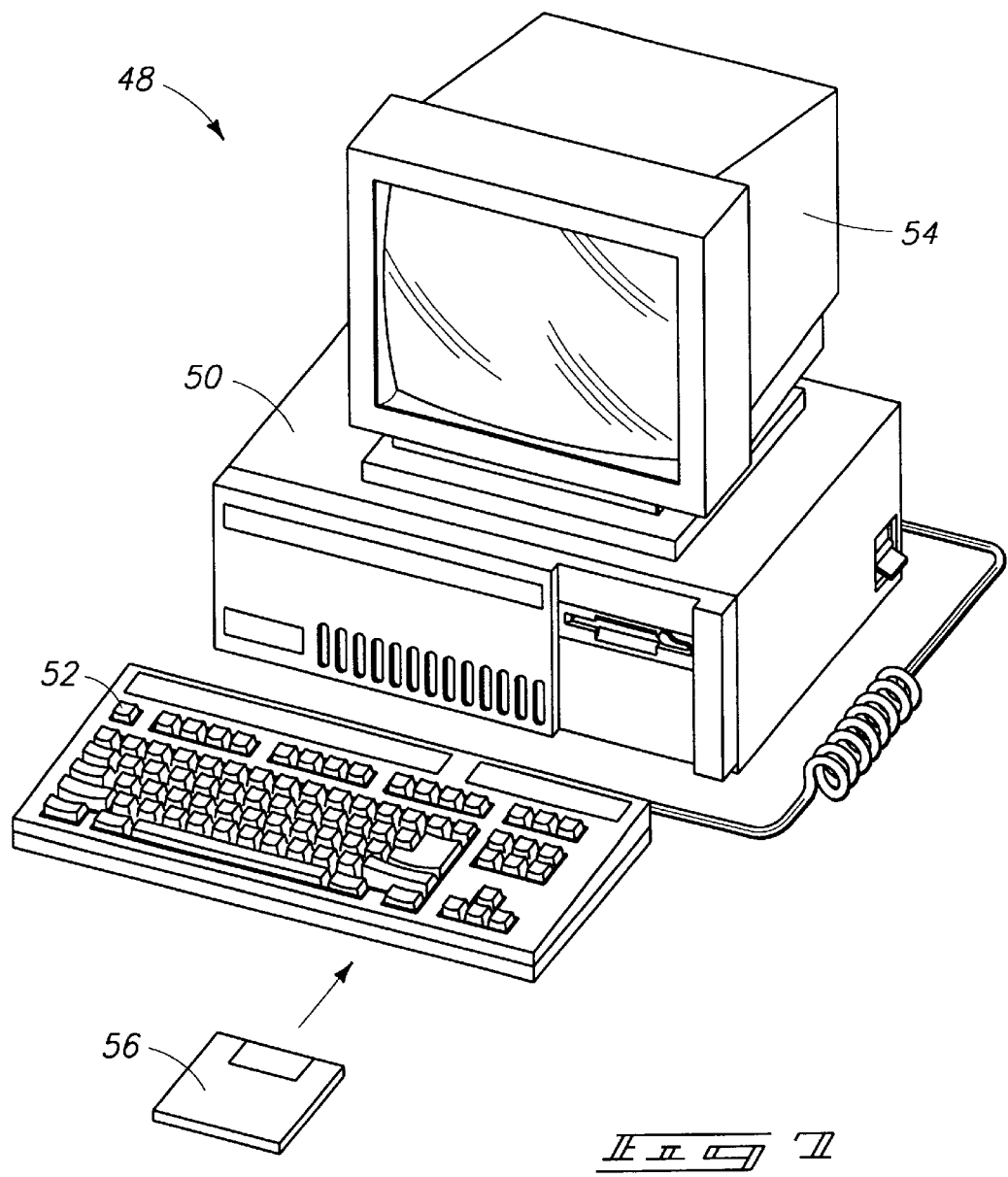
FIG. 7 is a view of a semiconductor wafer alignment tool in accordance with one embodiment of the invention.
Figure 8:
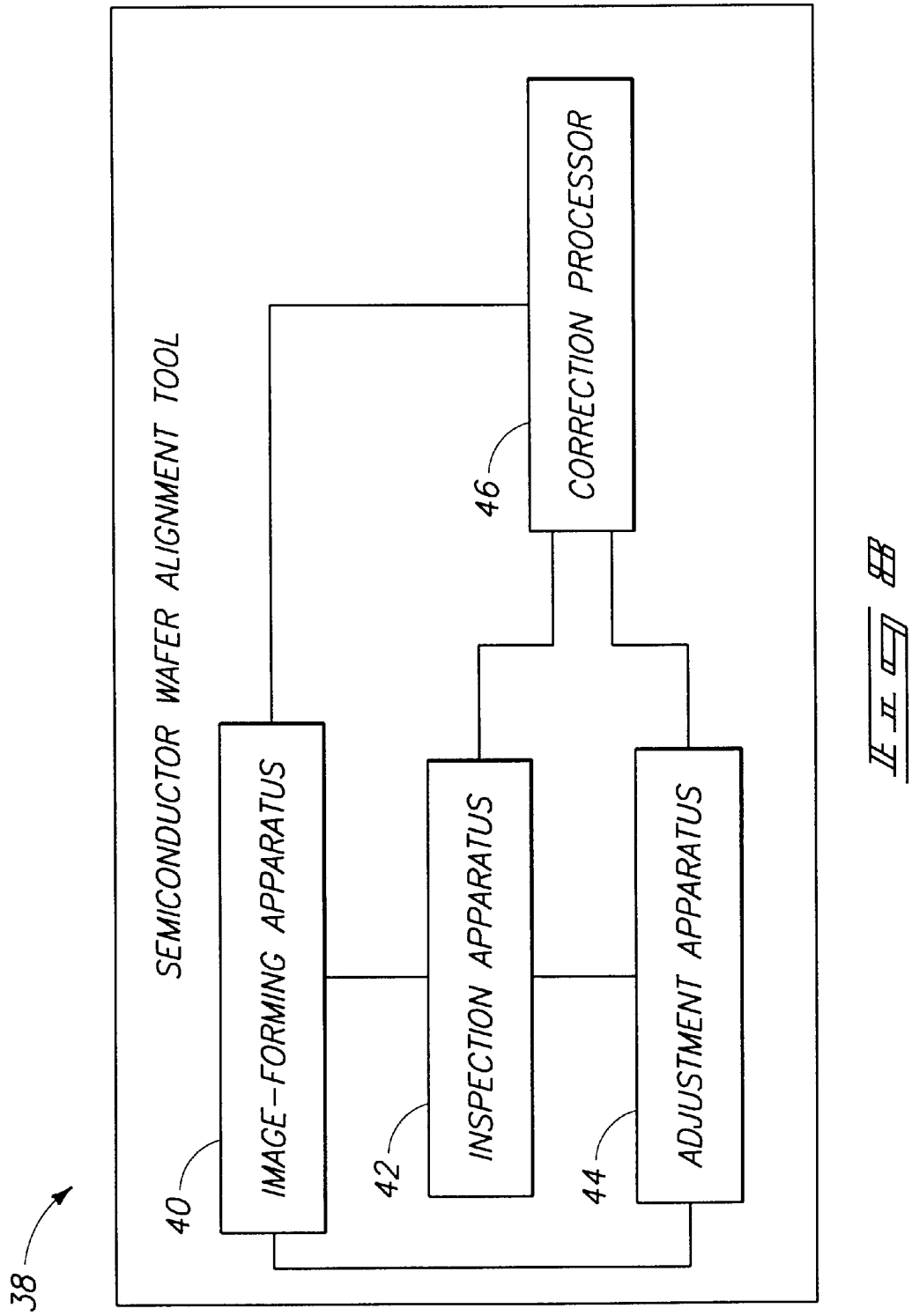
FIG. 8 is a high level schematic diagram of a semiconductor wafer alignment tool.

Referring to FIGS. 7 and 8, and in accordance with one embodiment of the invention, a semiconductor wafer alignment tool is shown generally at 38 (FIG. 8) and comprises an image-forming apparatus 40, an inspection apparatus 42, an adjustment apparatus 44, and a correction processor 46.

Image-forming apparatus 40 is configured to form a latent image of an alignment pattern which is receivable by a masking layer over a substrate. An inspection apparatus 44 is operably coupled with image-forming apparatus 40, and is configured to enable inspection of the position of the latent image of the alignment pattern relative to an underlying layer of material over the substrate. The inspection apparatus can also ascertain whether the latent image is aligned or misaligned relative to the underlying layer. In a preferred embodiment, adjustment apparatus 44 is operably coupled with the image-forming apparatus and is configured to make image alignment adjustments relative to a misalignment of the latent image. In a further preferred embodiment, correction processor 46 is operably coupled with the adjustment apparatus 44, inspection apparatus 42, and image-forming apparatus 40, and is configured to calculate an image adjustment and provide the calculated image adjustment to the adjustment apparatus 44 for operation thereon. One or more of the above-described apparatus, or components thereof comprising the alignment tool 38 can be implemented in any suitable hardware, software, or firmware.

In but one embodiment, semiconductor wafer alignment tool 38 can comprise a programmable computer, such as the one shown generally at 48 in FIG. 7. Computer 48 can be used or programmed to implement the various methods of the invention. Computer 48 can include a hard drive 50, an input device 52, and an output device 54. Hard drive 50 generally includes a central processing unit (CPU) and a memory system that communicate through a bus structure. The CPU includes an arithmetic logic unit (ALU) for performing computations, various registers for temporary storage of data and instructions, and a control unit for controlling the operation of the computer in response to instructions to a computer program such as an application or an operating system.

The memory system generally includes a high-speed main memory in the form of a medium such as a random-access memory (RAM) and read-only memory (ROM) semiconductor devices and secondary storage in the form of a medium such as floppy disks, hard disks, 56, tape, CD-ROM, etc. and other devices that use optical or magnetic recording material. The memory system stores programs such as a computer's operating system and currently running application programs, e.g. such as those which implement one or more of the inventive methods described above. The main memory also includes a video display memory for displaying images through a display output such as monitor 54. Input device 52 and output device 54 are typically peripheral devices connected by bus structure to the computer. Input device may be a keyboard as indicated, but may also be a modem, pointing device, pen, or other device for providing input data to the computer. The input device can also include various optical scanning devices which are capable of examining the alignment patterns in measuring the desired parameters described above. An exemplary device is a so-called stepper. An output device 54 may be a monitor as indicated, but may also be a printer, modem, sound device or other device for providing output data from the computer. The input and output devices may be combined into a single device if desired.

The various invented methods and apparatus can be used to process one wafer per lot, multiple wafers per lot, every wafer in a lot, or every masking field on a wafer. Advantages of the present methods and apparatus include real time correction of image misalignment which can reduce processing time thereby increasing wafer throughput. Other advantages include tighter alignment tolerances which can be achieved with system-corrected alignment. In addition, system-corrected alignment can reduce alignment errors by further removing the human factor from the alignment process. Hence, wafer rework can be reduced through the error reductions provided by the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer alignment tool comprising:

an image-forming apparatus configured to form a latent image of an alignment pattern receivable by a masking layer over a substrate; and an inspection apparatus operably coupled with the image forming apparatus and configured to enable inspection of the position of the latent image of the alignment pattern relative to an underlying layer of material over the substrate and ascertain whether the latent image is aligned relative to the underlying layer.

2. The semiconductor wafer alignment tool of claim 1 further comprising an adjustment apparatus operably coupled with the image-forming apparatus and configured to make image alignment adjustments responsive to a misalignment of the latent image.

3. The semiconductor wafer alignment tool of claim 2 further comprising a correction processor operably coupled with the adjustment apparatus and the inspection apparatus and configured to calculate an image adjustment and provide said calculated image adjustment to the adjustment apparatus for operation thereon.

4. A semiconductor wafer alignment tool comprising:

an image-forming apparatus configured to form a latent image of one set or another of alignment patterns and circuitry patterns formed on a photomask, the latent image receivable by a masking layer over a substrate; and an inspection apparatus operably coupled with the image forming apparatus and configured to enable inspection of the position of the latent image of the alignment pattern relative to an underlying layer of material over the substrate and ascertain whether the latent image is aligned relative to the underlying layer.

5. The semiconductor wafer alignment tool of claim 4 further comprising an adjustment apparatus operably coupled with the image-forming apparatus, the adjustment apparatus configured to make image alignment adjustments responsive to a misalignment of the latent image.

6. The semiconductor wafer alignment tool of claim 5, wherein the adjustment apparatus is configured to reposition the substrate and/or the photomask to make the image alignment adjustments responsive to a misalignment of the latent image.

7. The semiconductor wafer alignment tool of claim 4 further comprising a correction processor operably coupled with the adjustment apparatus and the inspection apparatus, the correction processor configured to calculate an image adjustment and provide said calculated image adjustment to the adjustment apparatus for operation thereon.

8. The semiconductor wafer alignment tool of claim 4, wherein the image-forming apparatus is configured to form at least two latent images of the set of alignment patterns, and wherein the inspection apparatus is configured to ascertain whether the latent images of the alignment patterns are aligned in X and Y directions.

9. The semiconductor wafer alignment tool of claim 1, wherein the image-forming apparatus is configured to form latent images of at least two alignment patterns, and wherein the inspection apparatus is configured to ascertain whether the latent images of the alignment patterns are aligned in X and Y directions.

* * * * *

UNITED STATES PATENT AND TRADEMARK OFFICE
CERTIFICATE OF CORRECTION

PATENT NO. : 6,259,525 B1
DATED : July 10, 2001
INVENTOR(S) : Doug David

It is certified that error appears in the above-identified patent and that said Letters Patent is hereby corrected as shown below:

<u>Column 3,</u>
Line 7, replace "patter" with -- pattern --.

Signed and Sealed this

Eleventh Day of December, 2001

Attest:

Nicholas P. Godici

NICHOLAS P. GODICI
*Attesting Officer*  *Acting Director of the United States Patent and Trademark Office*